(12) United States Patent
Mosley

(10) Patent No.: US 7,019,346 B2
(45) Date of Patent: Mar. 28, 2006

(54) CAPACITOR HAVING AN ANODIC METAL OXIDE SUBSTRATE

(75) Inventor: Larry E. Mosley, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 111 days.

(21) Appl. No.: 10/746,767

(22) Filed: Dec. 23, 2003

(65) Prior Publication Data
US 2005/0136608 A1    Jun. 23, 2005

(51) Int. Cl.
*H01L 27/108* (2006.01)
*H01L 29/76* (2006.01)
*H01L 29/94* (2006.01)
*H01L 31/119* (2006.01)

(52) U.S. Cl. ............ 257/296; 257/298; 257/309; 977/DIG. 1

(58) Field of Classification Search ........... 257/296, 257/298, 309; 977/DIG. 1
See application file for complete search history.

(56) References Cited

U.S. PATENT DOCUMENTS

| | | | |
|---|---|---|---|
| 6,262,877 B1 * | 7/2001 | Mosley | 361/306.2 |
| 6,515,325 B1 * | 2/2003 | Farnworth et al. | 257/296 |
| 6,800,886 B1 * | 10/2004 | Awano | 257/276 |
| 6,819,001 B1 * | 11/2004 | Burdick et al. | 257/778 |
| 6,828,786 B1 * | 12/2004 | Scherer et al. | 324/300 |
| 6,842,328 B1 * | 1/2005 | Schott et al. | 361/302 |
| 6,858,891 B1 * | 2/2005 | Farnworth et al. | 257/296 |
| 6,891,319 B1 * | 5/2005 | Dean et al. | 313/309 |
| 6,891,724 B1 * | 5/2005 | De Lorenzo et al. | 361/704 |
| 2004/0087102 A1 * | 5/2004 | Nagai et al. | 438/396 |

OTHER PUBLICATIONS

Rabin et al. "Arrays of Nanowires on Silicon Wafers"; Aug. 25-29, 2002, IEEE, pp. 276-279.*

Nielsch et al. "Switching Behavior of Single Nanowires Inside Dense Nickel Nanowire Arrays"; Sep. 2002, pp. 2571-2573.*

Lu et al., "Synthesis and characterization of conducting copolymer nanofibrils of pyrrole and 3-methylthiophene using the template-synthese method," Materials Science and Engineering A334, 2002, pp. 291-297.

Peng et al., "Magnetic properties and magnetization reversal of -Fe nanowires deposited in alumina film," J. of Applied Physics, vol. 87, No. 10, May 15, 2000, pp. 7405-7408.

* cited by examiner

*Primary Examiner*—Maria F. Guerrero
(74) *Attorney, Agent, or Firm*—Schwabe, Williamson & Wyatt, P.C.

(57) ABSTRACT

A structure and method including an anodic metal oxide substrate used to form a capacitor are described herein.

17 Claims, 7 Drawing Sheets

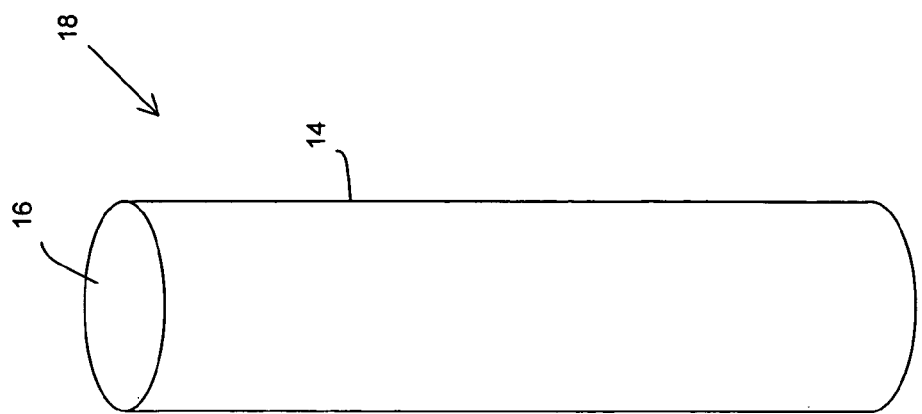
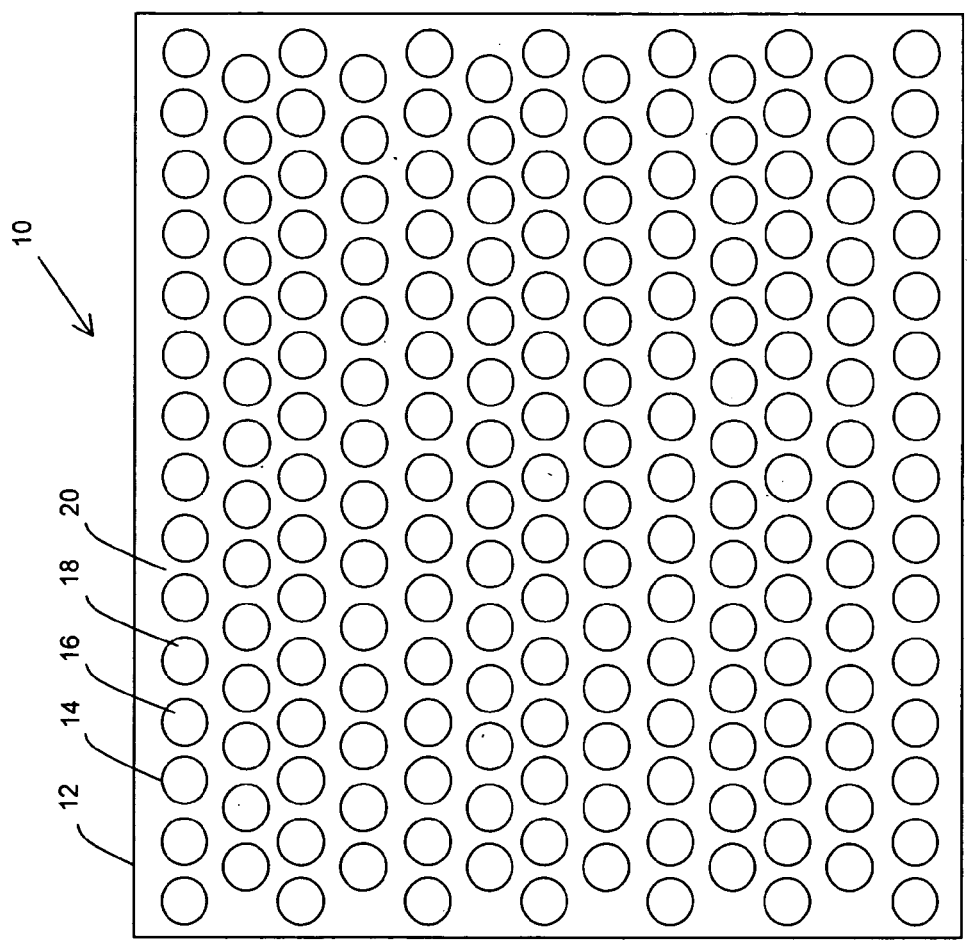

CAPACITOR HAVING AN ANODIC METAL OXIDE SUBSTRATE

FIELD OF THE INVENTION

The present invention relates to electronic devices, and in particular, to capacitors.

BRIEF DESCRIPTION OF THE DRAWINGS

FIG. 1A is a top view of an (anodic Metal Oxide) AMO substrate.

FIG. 1B is an enlarged side view of one of a plurality of nanopores formed in the AMO substrate of FIG. 1A.

DETAILED DESCRIPTION OF ILLUSTRATIVE EMBODIMENTS

Figure 2:
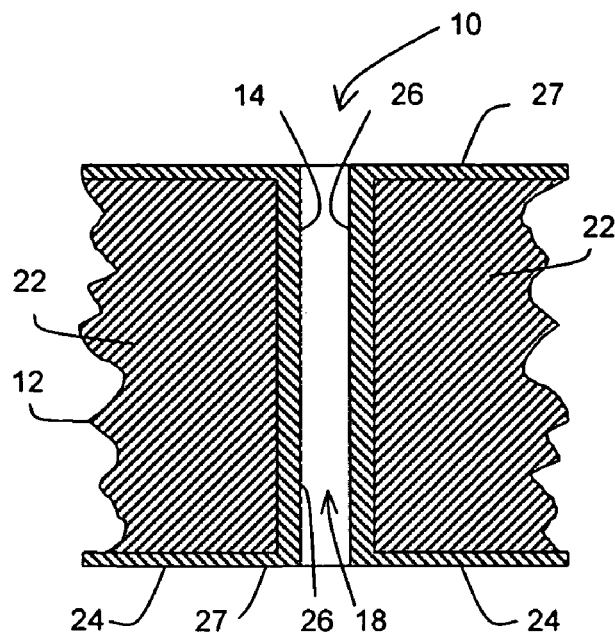
FIG. 2 is a fragmented, enlarged cross-sectional view of the AMO substrate of FIG. 1A showing an oxide layer grown thereon and a nanopore.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Anodic Aluminum Oxide (AAO) substrates and their formation have been described in the literature (e.g. Peng et. al., J. Of Applied Physics, Vol. 87, p7405, 2000). These AAO substrates have been used as templates in growing or forming nanofibrils, which are also referred to as nanowires or nanotubes. Many of these nanowires are formed of metal (e.g. Peng et. al., J. of Applied Physics, Vol. 87, p7405, 2000) or electrically conductive polymers (e.g. Lu et. al., Materials Science and Engineering, A334, p291, 2002). In the literature the AAO substrates have then been used as sacrificial templates to form nanowires within their nanopores. After the formation of the nanowires, the AAO templates are dissolved away using a NaOH solution leaving only the nanowires.

In accordance with one embodiment of the invention, an Anodic Metal Oxide (AMO) substrate may be used as a template to form a high density capacitor, referred to as an AMO capacitor. In general, this topology uses the AMO substrate to provide a template for forming nanofibrils, nanowires or nanotubes (hereinafter referred to as "nanowires"), so as to make the high density capacitor. FIGS. 1–4 provide a basic topology for making the capacitor, which may provide a basis of several applications. As one example of an application, this topology may be used to form a high density array capacitor using the AMO substrate, as discussed with respect to FIGS. 5–11. As an example of another application, this topology may be used to form a low profile, high density capacitor interposer using the AMO substrate, as discussed with respect to FIG. 12. Other applications of this topology for forming capacitors are possible.

With reference to FIG. 1A, an AMO substrate 10 is shown which includes an anodized metal plate 12. The anodization process causes a plurality of nanopores 14 to be formed in the anodized metal plate 12. In one embodiment the anodized metal plate 12 is formed from aluminum; hence, in this embodiment the AMO substrate 10 may be described as being an Anodic Aluminum Oxide (AAO) substrate and the anodized metal plate 12 may be described as an aluminum plate. However, the description Anodic Metal Oxide (AMO) is used instead of AAO, because metals other than aluminum also may be used for the AMO substrate 10 and the plate 12. More specifically, it is contemplated that other metals, such as titanium or tungsten, may be used to form the AMO substrate 10 and the anodized metal plate 12, in which case even larger capacitance densities may be achieved due to their higher relative dielectric constants.

Referring to FIGS. 1A and 1B, there is shown a plurality of nanopores 14, with each nanopore having a wall 16 with a substantially circular cross-section. The nanopores 14 form a plurality of columns 18. The anodizing process may result in the formation of a plurality of hexagonal arrays of the columns 18, although any configuration of the columns may be used with the capacitors in accordance with the embodiments of the present invention. These columns 18 may be disposed in perpendicular relationship to a surface 20 of the substrate 10. The nanopores 14 may have diameters ranging from 10's to 100's of nanometers, with similar spacing and lengths of up to 10's of microns. The density of the nanopores 14 may be on the order of $10^{10}$ to $10^{11}$ per $cm^2$. One of the columns 18 is shown in more detail in an enlarged side view of FIG. 1B.

Referring to FIG. 2, a fragmented enlarged portion of the AMO substrate 10 is shown to show the effects by the anodization process on the AMO substrate 10. As a result of the anodization process, the anodized metal plate 12 includes a core metal plate 22, the plurality of nanopores 14, and a thin, insulating, conformal oxide layer 24 formed over the surfaces of the core metal plate 22, including the walls of the nanopores 14. That part of the oxide layer 24 in the nanopores 14 may be referred to as a sidewall oxide layer 26. That part of the oxide layer 24 on the top and bottom sides of the core metal plate 22 may be referred to as outer oxide layer 27. The sidewall oxide layer 26 and the outer oxide layer 27 are integral portions of the oxide layer 24 that is formed during the anodization process. In FIG. 2, only a single column 18 of a single nanopore 14 of the plurality of nanopores is shown in this fragment view. In summary, the anodization process forms both the nanopores 14 and the oxide layer 24.

Figure 3:
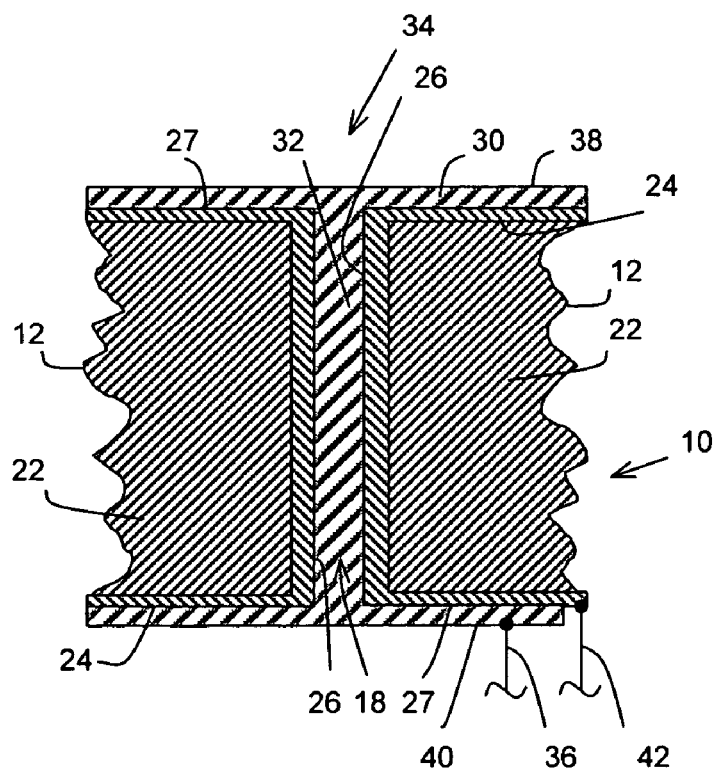
FIG. 3 is a fragmented, enlarged cross-sectional view of the AMO substrate of FIG. 3 having nanowires deposited in the nanopores to form a capacitor, in accordance with one embodiment of the invention.

Referring to FIG. 3, a cross-section of the nanopore 14 within the AMO substrate 10 is shown filled with a deposited conductive material 30, such as a conductive metal or an electrically conductive polymer. That portion of the conductive material 30 filling each of the nanopores 14 defines a nanowire 32. The conductive material 30 may cover the oxide layer 24 of the anodized metal plate 12, with the nanopores 14 being completely filled. More specifically, the conductive material may cover the outer oxide layer 27 and the plurality of sidewall oxide layers 26 of the plurality of nanopores 14. This structure defines a capacitor 34, i.e., an AMO capacitor. More specifically, the core metal plate 22 may act as one terminal (i.e., anode) of a capacitor 34; the oxide layer 24 may form a dielectric layer of the capacitor 34; and the conductive material 30, and in particular the nanowires 32, may act as the other terminal (i.e., cathode) of the capacitor 34. Making a first electrical connection 36 to the terminal formed by the conductive material 30 (i.e., cathode) may readily be accomplished by any number of ways, e.g., electrical contact with one of a top conductive layer 38 or bottom conductive layer 40 of the conductive material 30, which is distributed on the outer oxide layer 27 on the top and bottom sides of the core metal plate 22. The top and bottom conductive layers 38 and 40 of the conductive material 30 may electrically interconnect all the nanowires 32 formed in the AMO substrate 10. To establish a second electrical connection 42 to the core metal plate 22 may be accomplished either by masking off or otherwise preventing parts of the core metal plate 22 from being anodized, or alternatively, by further processing after the anodization of the core metal plate 22 to expose areas of the core metal plate 22. With these electrical connections, the AMO substrate 10 has two conductive layer paths and thereby providing capacitance via the capacitor 34 between the conductive layer paths when an electric potential (not shown) is applied to the first and second connections 36 and 42.

Figure 4:
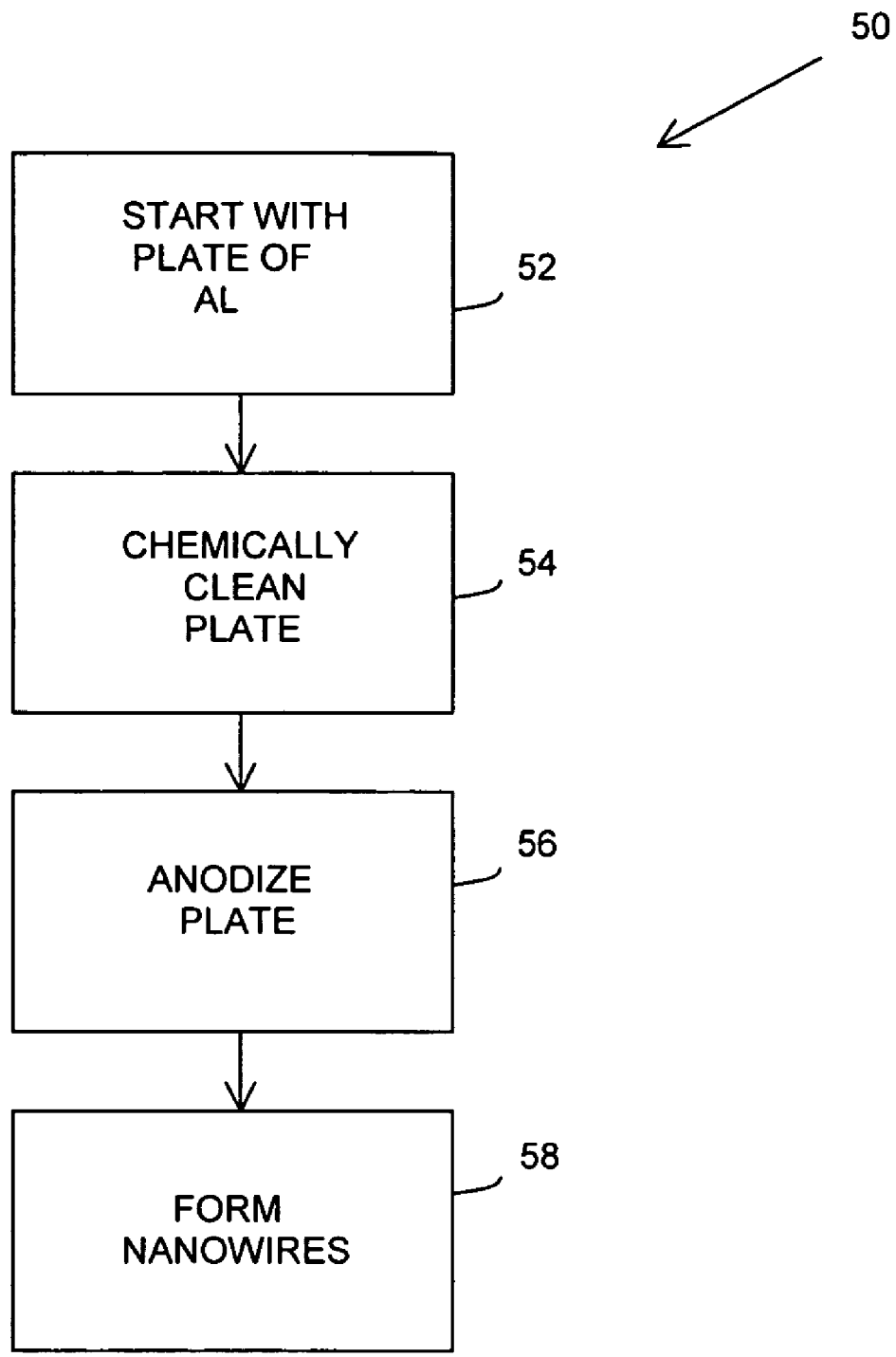
FIG. 4 is a flow chart of a fabrication procedure, in accordance with one embodiment of the invention, for forming the capacitor of FIG. 3, in accordance with one embodiment of the invention.

Referring to FIG. 4, a simplified flowchart of a procedure 50 of fabrication, in accordance with one embodiment of the invention, is shown which may be used to produce the capacitor of FIG. 3. It should be understood that other procedures also may be used to fabricate the high density capacitors shown herein of the various embodiments in accordance with the present invention. Likewise, the procedure 50, in accordance with one embodiment of the invention, also may be used to fabricate other embodiments of capacitors than those shown herein. At 52, the procedure 50 starts with the plate or foil of high purity aluminum. At 54, the aluminum plate is chemically cleaned to remove the native oxide on the surface. At 56, the aluminum plate is then anodized in an acid solution, typically sulfuric or phosphoric acid. Various concentrations of the acid, voltages, temperatures and times may be used. Under these conditions a porous, nearly periodic, structure is formed in the anodized aluminum plate, i.e., the AMO substrate as previously shown in FIGS. 1A and 2. At 58, the conductive material is deposited over the thin oxide layer of the surfaces of the AMO substrate, causing the conductive nanowires to be formed in the nanopores of the AMO substrate. Hence, the AMO substrate 10 may also be viewed as being a template for forming the nanowires.

Using conservative estimates of $10^{10}$ columns per $cm^2$, with an internal diameter of 70 nm and a length of 1 um, a capacitance density of approximately 10 uF/$cm^2$ may be achieved with aluminum (k~9.5) having an oxide thickness of 10 nm. This may be achieved with a plate having only 1 um thickness. The letter k refers to dielectric constant. Hence, it is contemplated that by use of the procedure of FIG. 4, it may be possible to increase the capacitance density by at least an order of magnitude. It also is contemplated that other metals, such as titanium or tungsten, may be used to form these substrates in place of aluminum, in which case even larger capacitance densities may be achieved due to their higher relative dielectric constants. In summary, one embodiment of the present invention, as shown in FIGS. 1–4, includes a novel capacitor technology that may provide volumetric capacitance densities substantially greater than most other technologies, for example, possibly greater than four times that of prior art ceramic embodiments, even though Barium Strontium Titinate (BST) of the ceramic embodiments may have a much greater dielectric constant.

Figure 5:
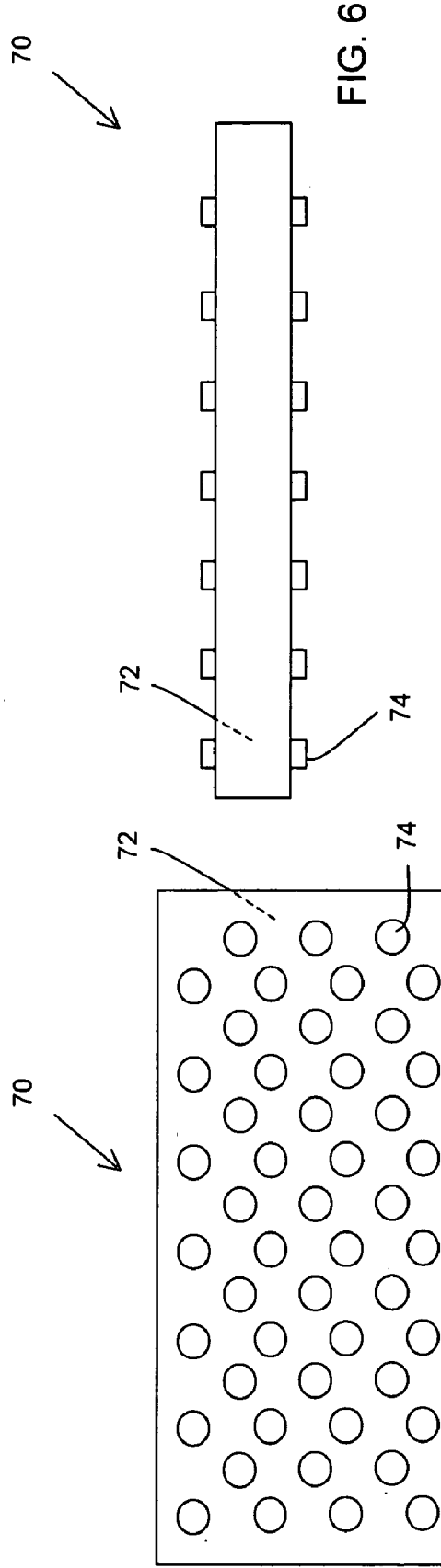
FIG. 5 is a top view of an AMO substrate with protective coating to be used in forming an array capacitor, in accordance with another embodiment of the present invention.
Figure 6:
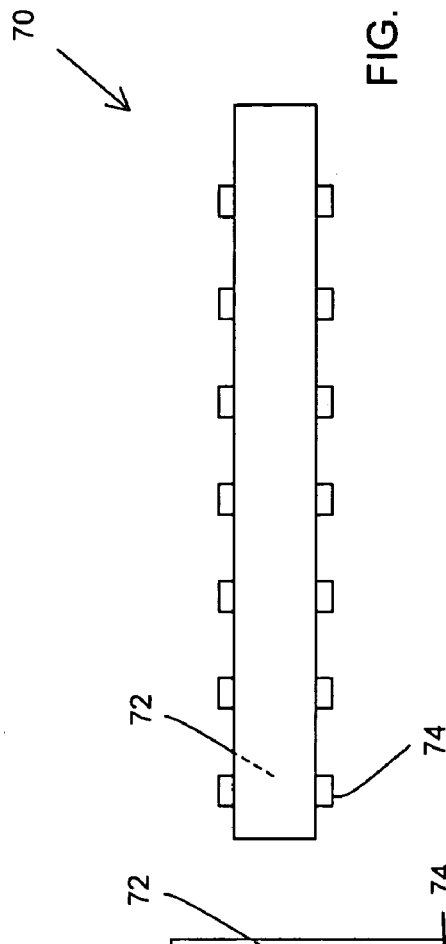
FIG. 6 is a side view of the AMO substrate of FIG. 5.

Referring to FIGS. 5 and 6, there is illustrated an AMO substrate 70, after being anodized, intended for use in forming an array capacitor in accordance with another embodiment of the present invention. The AMO substrate 70 includes a core metal plate or foil 72, with a plurality of nanopores (not visible in FIGS. 5 and 6) passing through the metal plate 72 from the top side to the bottom side of the AMO substrate 70. Additionally, the AMO substrate 70 includes an oxide layer covering the top and bottom sides of the metal plate 72 and also the walls of the nanopores. The anodization process produces both the nanopores and the oxide layer. The formation of this array capacitor using the AMO substrate 70 to this point incorporates the topology previously described with respect to FIG. 1A. Additionally, the AMO substrate 70 has a plurality of spaced-apart protective layers or coatings 74 deposited on the metal plate 72 prior to the anodizing process. These protective coatings allow for small segments of the AMO substrate 70 not to be anodized. In other words, under these coatings 74 there will be no nanopores and no oxide layer. Instead, with the removal of at least a part of the protective coating 74 (e.g., center) after anodization, the underlying metal plate 72 may be accessed. The protective coatings 74 may be distributed in a uniformly pattern. The protective coatings may be formed by photoresist spun on the metal plate 72 or by screen printing of the metal plate 72. In this embodiment, the protective coating 74 may be distributed on both the top and bottom (both sides) of the AMO substrate 70. However, in other embodiments distributing the protective coatings 74 on only one side, or less than all of one side, may be desirable.

Figure 7:
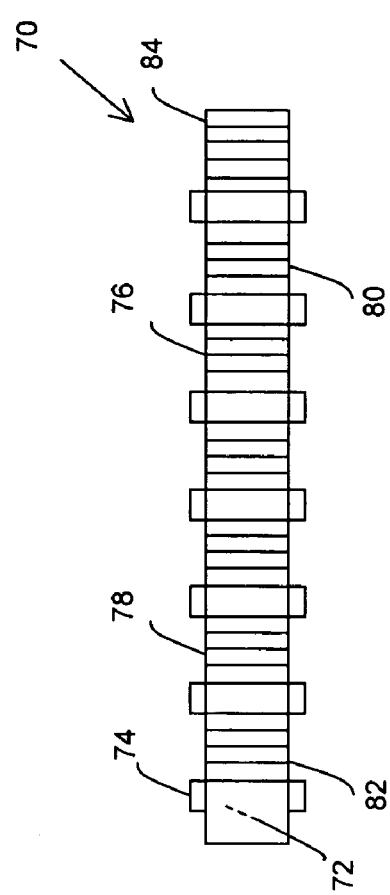
FIG. 7 is a cross sectional, side view of an AMO substrate of FIGS. 5 and 6 which shows a plurality of nanopores and nanowires.

As shown in cross-sectional view of FIG. 7, the AMO substrate 70 of FIGS. 5 and 6 has a plurality of nanopores 76. Since the nanopores 76 form perpendicular to a top surface 78, they form columns within the unprotected areas 80 not shielded by the protective coatings 74, but do not form nanopores where the protective coatings 74 are positioned. Although the oxide layer is not visible, there also is no oxide layer under the protective coatings 70. More specifically, the AMO substrate 70 is coated with a thin, conformal, insulating oxide layer during the anodization process in the unprotected areas 80 but not in the protected areas under the protective coatings 74. Thereafter, a conductive material 84, such as a metal or electrically conductive polymer, may be deposited on the top and bottom surfaces of the AMO substrate 70. This forms a plurality of nanowires 82 within the nanopores 76. The conductive material 84 on the top and bottom of the AMO substrate may electrically interconnect the nanowires 82. Again, the metal plate 72 provides one terminal (i.e., anode) for the array capacitor and the conductive material 84 (i.e., cathode) provides the other terminal of the capacitor, with the oxide layer forming the insulating dielectric of the array capacitor. To expose the anode (metal plate 72), the center of the protective coatings 74 may be opened. Opening the protective coatings 74 may be through photo lithography if it is a photoresist. It is also contemplated that laser ablation may be another possibility for opening the protective coatings 74.

Figure 8:
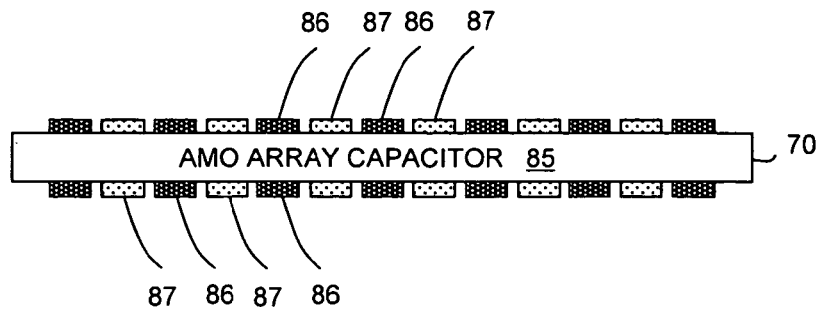
FIG. 8 is side view an AMO array capacitor, formed from the AMO substrate of FIGS. 5–7, in accordance with another embodiment of the present invention.

Referring to FIG. 8, an AMO array capacitor 85, formed from the AMO substrate 70 of FIGS. 5–7, is shown with a plurality of power terminals 86 and a plurality of ground terminals 87. The terminals 86 and 87 may be on both sides of the AMO array capacitor 85 as illustrated in FIG. 8. The power and ground terminals 86 and 87 may alternate. The power terminals 86 may be electrically coupled to the metal plate, i.e., the anode. As previously described with respect to FIGS. 5–7, the electrical connections for the power terminals 86 may be established by opening the centers of the protective coatings disposed on the metal plate. The ground terminals 87 may be connected to the conductive material and the nanowires, i.e., cathode. In this manner, two groups of current paths are formed in the AMO array capacitor 85. The first group of current paths extends from a plurality of the power terminals 86 on one side of the array capacitor 85 to a plurality of the power terminals 86 on the other side of the array capacitor 85. The second group of current paths extends from a plurality of the ground terminals 87 on one side of the array capacitor 85 to a plurality of the ground terminals on the other side of the array capacitor 85. The two groups of current paths may be characterized as defining two conductive layer paths, one though the metal plate and one through the conductive material including the nanowires. The array capacitor 85 generates capacitance between these two conductive layer paths.

A large number of these current paths within the first and second groups provide for reduced inductance, which is especially beneficial when the paths are used for power supply lines for a die. The grid pattern, as best shown in FIG. 5, may be provided by alternating each of the current paths (alternating power and ground terminals 86 and 87) through the array capacitor 85. The alternating of the opposite direction current paths result in a further reduction of inductance due to the cancellation of inductance resulting from the mutual coupling of the opposite flowing current. Although the power and ground terminals 86 and 87 are shown on both sides of the AMO array capacitor 85, there may be applications where terminals on only one side may be desirable, as shown by an AMO array capacitor 90 in FIG. 9.

Figure 9:
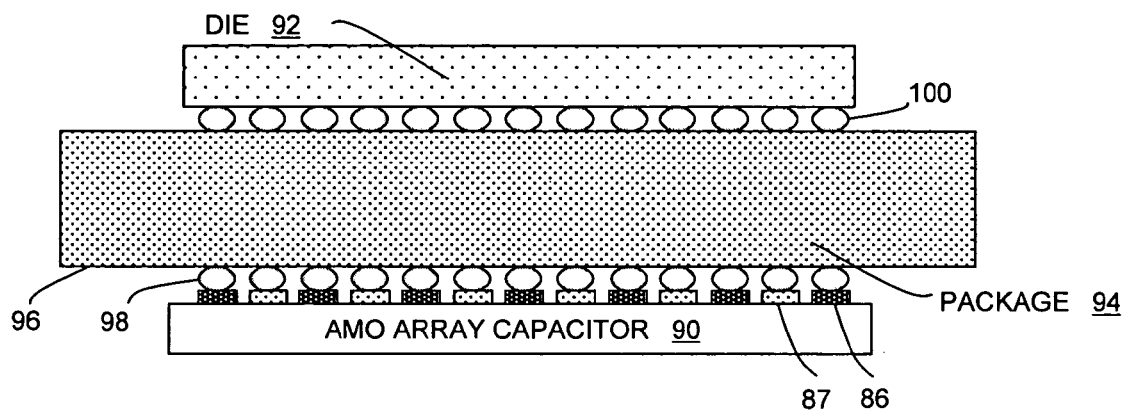
FIG. 9 is a side view of an IC package using another AMO array capacitor in accordance with yet another embodiment of the invention.
Figure 10:
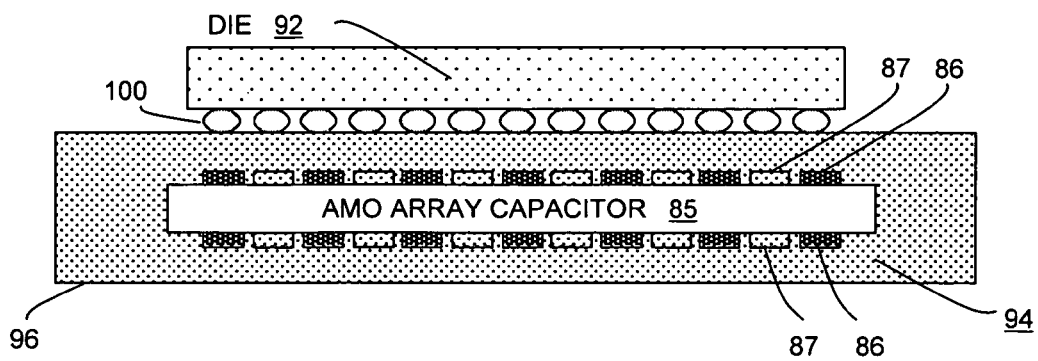
FIG. 10 is a side view of another IC package having embedded therein the AMO array capacitor of FIG. 8.

Referring to FIGS. 9 and 10, the AMO array capacitor, according to the present invention, is incorporated into two illustrative electronic assemblies, each including a die 92 and an Integrated Circuit (IC) package 94. The die 92 may be any integrated circuit die and, more specifically, may be a processor die. Further process steps are needed for attachment of the terminals 86 and 87 of the AMO array capacitor to the die 92 and the IC package 94. Two different methods of attachment are illustrated in the FIGS. 9 and 10. In FIG. 9, the AMO capacitor array 90 is attached to the land side surface 96 of the IC package 94 by a plurality of solder bumps 98 interposed between the terminals 86 and 87 and a plurality of land pads (not shown) mounted on the surface 96 of the package 94. The package 94 is connected to the die 92 by a plurality of solder bumps 100. In FIG. 10, the AMO array capacitor 85 is embedded or encapsulated in the IC package 94. The routing of the power and ground within the IC package 94 is not shown, but connections are made from the power and ground terminals 86 and 87 of the AMO array capacitor 85 to the die 92 via solder bumps 100. On the land side of the IC package 94, the terminals 86 and 87 are connected to a socket or motherboard (not shown).

With respect to FIGS. 8–10, the AMO arrays capacitors 85 and 90 comprise a single layer capacitor; however, multiple layers may be stacked to form even greater capacitance values. It is contemplated that this method may produce 10's perhaps even 100's of uf/cm$^2$ in a single layer. The higher capacitance density may allow use of cheaper discrete capacitors in the package 94 for second droop and may potentially remove the need for additional second droop capacitors with the higher capacitance densities.

Figure 11:
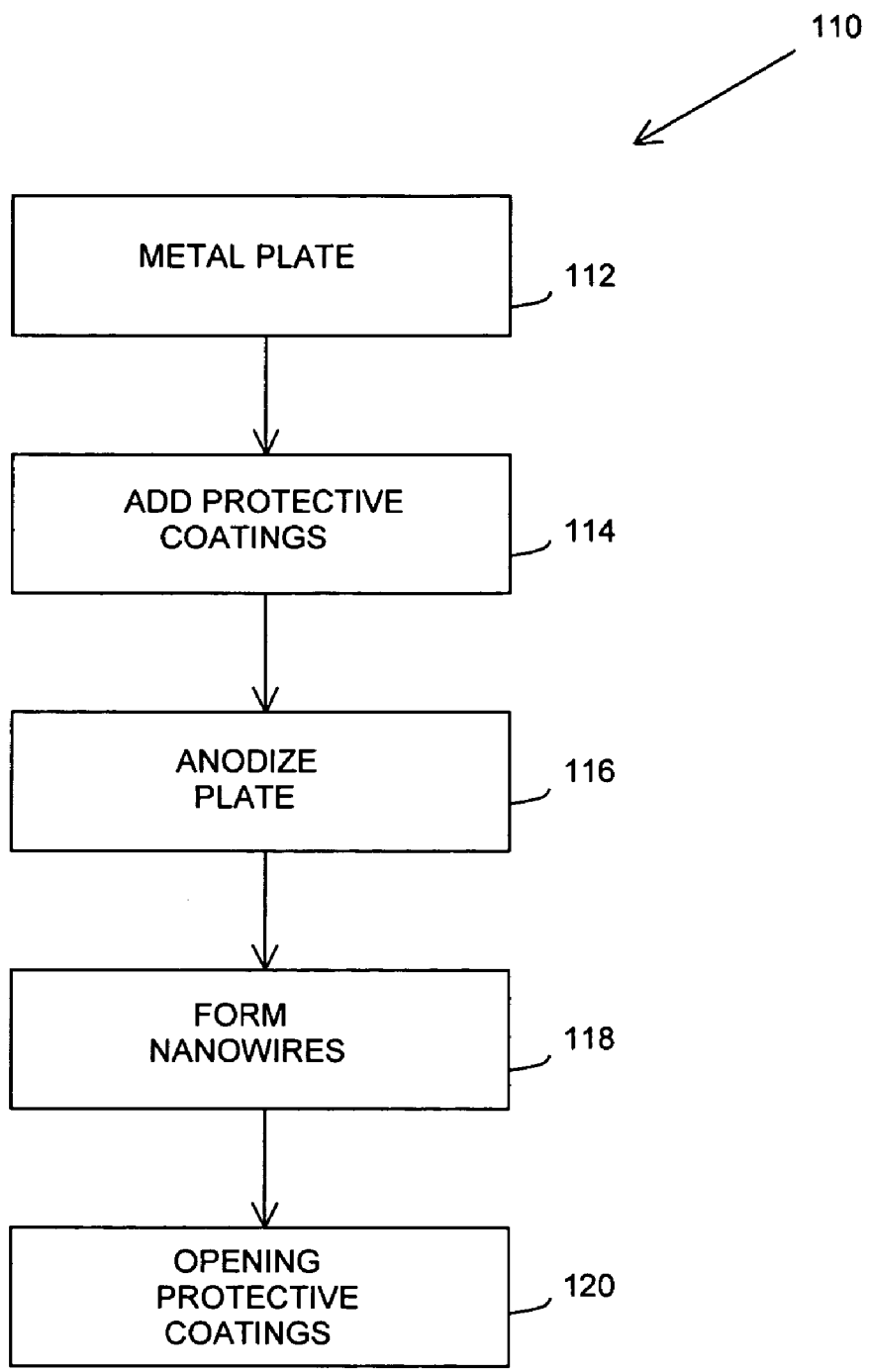
FIG. 11 is a flow chart of a fabrication procedure for making the AMO array capacitor of FIGS. 8 and 9 in accordance with another embodiment of the invention.

Referring to FIG. 11, a process 110 for forming the AMO array capacitors of FIGS. 8–10 is summarized in a flow chart. Assuming that the process starts with an already cleaned metal plate at 112, the protective coatings are added at 114 to the metal plate or foil. Thereafter, at 116 the metal plate is anodized to form a plurality of nanopores and an oxide layer in places where there are no protective coatings. Next, at 118, the conductive material is deposited on the AMO substrate to form nanowires in the nanopores and coat the sides of the AMO substrate. Next, at 120 the protective coatings are opened to expose the underlying metal plate so as to provide the power terminals.

Figure 12:
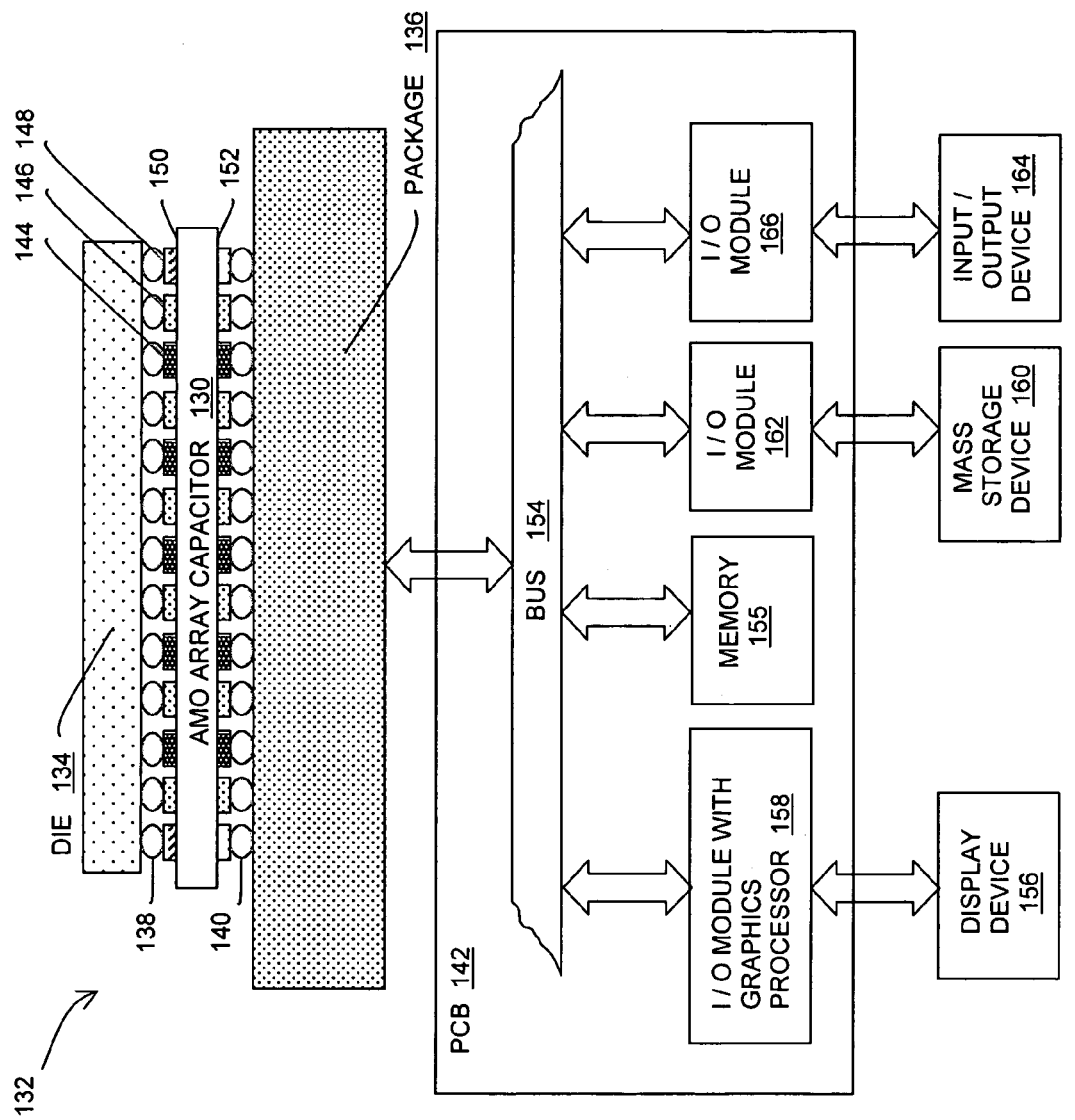
FIG. 12 is a side view on a system incorporating an AMO capacitor interposer in accordance with another embodiment of the invention.

Referring to FIG. 12, there is shown an AMO capacitor interposer 130 in accordance with another embodiment of the present invention. More specifically, the AMO capacitor interposer 130 is incorporated into an electronic assembly of an illustrative system 132. The electronic assembly includes the AMO capacitor interposer 130, an IC die 134, and an IC package 136. The AMO capacitor interposer 130 is interposed between an IC die 134 and an IC package 136. Solder bumps 138 are used to provide electrical connections between the AMO capacitor interposer 130 and the die 134. Solder bumps 140 are used to provide electrical connections between the AMO capacitor interposer 130 and the IC package 136. Solder bumps 138 and 140 are sometimes referred to as C4 bumps because this style of interconnection is used in controlled collapse chip connection (i.e., C4) packaging. The package 136 is attached to a printed circuit board (PCB) 142 by solder balls (not shown). In this way electrical connection between IC die 134 and PCB 142 is made through the AMO capacitor 130.

The capacitance of the interposer 130 may be used as a decoupling capacitor. The need for such capacitance increases as the switching speed and current requirements of the IC die 134 become higher. By placing a decoupling capacitor closer to the IC die 134, the undesirable parasitic inductance associated with the leads is substantially reduced.

The AMO capacitor interposer 130 may include, on both sides thereof, a plurality of power terminals 144, a plurality of ground terminals 146, and a plurality of input/output (I/O) signal conductors 148. The conductive paths (not shown) of the power and ground terminals 144 and 146 may serve as the power supply paths for the IC die 134. These conductive paths are electrically isolated from I/O signal paths. The power and ground terminal 144 and 146 may be formed in the same manner as was described in FIG. 11. Additional process steps to those shown in FIG. 11 are required for fabricating the I/O signal conductors 148. One approach to form the I/O conductors 148 is to pre-form the I/O holes or tubes for the I/O signal conductors. For example, deep-vias (not shown) may be formed in the metal plate prior to anodization, with such deep-vias extending from one side to the other side of the metal plate in traversing relationship.

When putting on the protective coatings for the anode terminals, the protective coatings may also be applied around the I/O hole as well. Then, during the formation of the nanowires, the I/O connections may be formed as well.

Another way to fabricate the I/O signal conductors 148 may be to put the protective coatings on for the metal plate (anode terminals) and also put on the protective coatings in areas where the I/O connections are desired. Then the centers of the protective coatings for the I/O connections only may be opened up, while leaving alone the other protective coatings for the metal plate (anode terminals). Then during the anodization process, the holes (nanopores caused by the anodization) for the I/O conductors may be formed in the I/O area as well as in the cathode area. Thereafter, the nanowires may be formed in the I/O area and the cathode area. Forming the nanowires may then provide electrical paths through the AMO substrate from surface 150 to surface 152 for the I/O conductors 148 and through the cathode, but the two groups of nanowires would be electrically isolated. Thereafter, the process may be similar to the previously described process where the openings for the anode may be formed.

The side of interposer 130 that is populated with the solder bumps 138 may be referred to as the chip-side. The side of interposer 130 that is populated with the solder bumps 140 may be referred to as the bottom-side.

This capacitor interposer 130 may have a low profile and a high density capacitor. This method may produce 10's perhaps even 100's of uf/cm² in a single layer. The higher capacitance density may allow use of cheaper discrete capacitors on the package 136.

Referring to FIG. 12, the system 132 illustrated one of many possible systems in the AMO capacitor interposer 130 may be used. In this illustrative system, the IC die 134 may be a processor die and PCB 142 may be a motherboard. In addition to the IC package 136, the motherboard PCB 142 may have mounted thereon a main memory 155 and a plurality of input/output (I/O) modules for external devices or external buses, all coupled to each other by a bus system 154 on the motherboard PCB 142. More specifically, the system 132 may include a display device 156 coupled to the bus 154 by way of an I/O module 158, with the I/O module 158 having a graphical processor and a memory. The I/O module 158 may be on the PCB 142 as shown in FIG. 12 or on a separate expansion board. The system 132 may further include a mass storage device 160 coupled to the bus 154 via an I/O module 162. Another I/O device 164 may be coupled to the bus 154 via an I/O module 166. Additional I/O modules may be included for other external or peripheral devices or external buses.

Examples of the memory 155 include, but are not limited to, static random access memory (SRAM) and dynamic random access memory (DRAM). Examples of the mass storage device 160 include, but are not limited to, a hard disk drive, a compact disk drive (CD), a digital versatile disk driver (DVD), a floppy diskette, a tape system and so forth. Examples of the input/output devices 164 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 142. Examples of the bus system 154 include, but are not limited to, a peripheral control interface (PCI) bus, and Industry Standard Architecture (ISA) bus, and so forth. The bus system 154 may be implemented as a single bus or as a combination of buses (e.g., system bus with expansion buses). Depending upon the external device, internal interfaces of the I/O modules may use programmed I/O, interrupt-driven I/O, or direct memory access (DMA) techniques for communications over the bus 154. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A capacitor, comprising:
   an anodic metal oxide substrate having a plurality of nanopores formed therein;
   a plurality of nanowires disposed in the plurality of nanopores;
   the anodic metal oxide substrate including a core metal plate;
   each of the plurality of nanopores including an insulating sidewall oxide layer disposed between the core metal plate and the nanowire formed within the nanopore;
   at least one first terminal electrically coupled to the core metal plate; and
   at least one second terminal electrically coupled to the plurality of nanowires.

2. The capacitor according to claim 1, wherein the anodic metal oxide substrate further including an insulating outer oxide layer formed on a pair of opposed sides of the core metal plate and integrally formed with the sidewall oxide layers of the nanopores; and the capacitor further comprises:
   a conductive layer of a conductive material disposed on the outer oxide layer and disposed in the nanopores to form the nanowires; and
   the at least one second terminal being electrically coupled to the conductive layer.

3. The capacitor according to claim 1, further comprising:
   an insulating outer oxide layer formed on at least a part of one side of the core metal plate and integrally attached to the sidewall oxide layers of the nanopores;
   a conductive layer of a conductive material disposed on the outer oxide layer; and
   the nanowires being formed of the conductive material and being integrally attached to the conductive layer.

4. The capacitor according to claim 1, further comprising:
   an insulating outer oxide layer formed on a pair of opposed sides of the core metal plate and integrally formed with the sidewall oxide layers of the nanopores;
   a conductive layer of a conductive material disposed on the outer oxide layer; and
   the nanowires being formed of the conductive material and being integrally formed with the conductive layer.

5. The capacitor according to claim 3, further comprising:
   a plurality of spaced-apart protective coatings formed on the part of one side of the core metal plate;
   the at least one first terminal includes a plurality of the first terminals formed by a plurality of opening in the protective coatings to the core metal plate; and the at least one second terminal includes a plurality of the second terminals on the conductive layer.

6. The capacitor according to claim 5, wherein the plurality of protective coatings are uniformly distributed on the part of one side of the core metal plate.

7. The capacitor according to claim 5, wherein the plurality of first terminals comprises a plurality of power supply terminals and the plurality of second terminals comprises a plurality of ground terminals.

8. The capacitor according to claim 7, wherein the first terminals and second terminals are disposed in an alternating repetitive pattern.

9. The capacitor according to claim 4, further comprising:
a plurality of spaced-apart protective coatings formed on the pair of opposed sides of the core metal plate;
the at least one first terminal includes a plurality of the first terminals formed by a plurality of opening in the protective coatings to the core metal plate; and
the at least one second terminal includes a plurality of the second terminals on the conductive layer disposed on the outer oxide layer.

10. The capacitor according to claim 9, wherein the anodic oxide metal substrate includes a plurality of holes, each of the holes includes an input/output conductor.

11. The capacitor according to claim 10, wherein the nanopores, the nanowires, and the input/output conductors are disposed in traversing relationship through the anodic metal oxide substrate.

12. A system, comprising:
an electronic assembly including a processor die; an interposer coupled to the processor die; and an integrated circuit (IC) package coupled to the interposer;
a printed circuit board (PCB) including a bus coupled to the IC package; at least one input/output module coupled to the bus; and a memory coupled to the bus;
the interposer including an anodic metal oxide substrate having a plurality of nanopores formed therein; a plurality of nanowires disposed in the plurality of nanopores; a core metal plate; a plurality of insulating sidewall oxide layers formed in the nanopores; at least two first terminals disposed on the metal plate with one of the first terminals being coupled to the processor die and the other first terminal being coupled to the IC package; and at least two second terminal electrically coupled to the plurality of nanowires with one of the first terminals being coupled to the processor die and the other being coupled to the IC package.

13. The system according to claim 12, wherein the memory includes a dynamic random access memory and the input/output module comprises a networking interface.

14. The system according to claim 13, wherein the system is a selected one of a set-top box, an entertainment unit and a DVD player.

15. The system according to claim 14, wherein the interposer includes an insulating outer oxide layer formed on a pair of opposed sides of the core metal plate and integrally formed with the sidewall oxide layers of the nanopores; a conductive layer of conductive material disposed on the outer oxide layer; and the nanowires formed of the conductive material and integrally formed with the conductive layer.

16. The system according to claim 15, wherein the interposer further includes a plurality of spaced-apart protective coating formed on the pair of opposed sides of the core metal plate; the at least one first terminal includes a plurality of the first terminals formed by a plurality of opening in the protective coatings to the core metal plate; and the at least one second terminal includes a plurality of the second terminals on the conductive layer.

17. The system according to claim 16, wherein the interposer has a chip side adjacent to the processor die and a bottom side adjacent to the IC package; a first portion of the plurality of the first terminals are mounted on the chip side and are coupled to the processor die and a second portion of the first terminals are mounted on the bottom side and are coupled to the IC package; a first portion of the plurality of the second terminals are mounted on the chip side and are coupled to the processor die and a second portion of the second terminals are mounted on the bottom side and are coupled to the IC package; and a plurality of input/output conductors, coupled to the processor die and the IC package, disposed in a plurality of holes traversing the interposer.

* * * * *

UNITED STATES PATENT AND TRADEMARK OFFICE
CERTIFICATE OF CORRECTION

PATENT NO. : 7,019,346 B2
APPLICATION NO. : 10/746767
DATED : March 28, 2006
INVENTOR(S) : Larry E. Mosley It is certified that error appears in the above-identified patent and that said Letters Patent is hereby corrected as shown below:

Drawings
Figure 12
"AMO ARRAY CAPACITOR 130" should read --AMO CAPACITOR INTERPOSER 130--

Column 2
Line 48, "...the substrate 10..." should read --...the AMO substrate 10...--.

Column 4
Line 56, "...protective coatings 70..." should read --...protective coatings 74...--.

Column 5
Line 24, "...array capacitor 85..." should read --AMO array capacitor 85...--.
Line 26, "...array capacitor 85..." should read --AMO array capacitor 85...--.
Line 28, "...array capacitor 85..." should read --AMO array capacitor 85...--.
Line 29, "...array capacitor 85..." should read --AMO array capacitor 85...--.
Line 33, "...array capacitor 85..." should read --AMO array capacitor 85...--.
Line 41, "...array capacitor 85..." should read --AMO array capacitor 85...--.

Column 6
Line 44, "...AMO capacitor 130..." should read --AMO capacitor interposer 130...--.
Line 45, "...interposer 130..." should read --AMO capacitor interposer 130...--.

Column 7
Line 23, "...interposer 130..." should read --AMO capacitor interposer 130...--.
Line 25, "...interposer 130..." should read --AMO capacitor interposer 130...--.
Line 27, "...capacitor interposer 130..." should read --AMO capacitor interposer 130...--.
Line 66, "...bus system 154..." should read --...bus 154...--.

UNITED STATES PATENT AND TRADEMARK OFFICE
CERTIFICATE OF CORRECTION

PATENT NO. : 7,019,346 B2
APPLICATION NO. : 10/746767
DATED : March 28, 2006
INVENTOR(S) : Larry E. Mosley It is certified that error appears in the above-identified patent and that said Letters Patent is hereby corrected as shown below:

Column 8
Line 2, "...bus system 154..." should read --...bus 154...--.

Signed and Sealed this

Fifteenth Day of May, 2007

JON W. DUDAS
*Director of the United States Patent and Trademark Office*